(12) United States Patent
Sagun et al.

(10) Patent No.: US 7,955,041 B2
(45) Date of Patent: Jun. 7, 2011

(54) QUICK CHANGEOVER APPARATUS AND METHODS FOR WAFER HANDLING

(75) Inventors: Sonny Marquez Sagun, Baguio (PH); Rhonel Morada Penamora, Baguio (PH); Alan Simon Sernadilla, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 777 days.

(21) Appl. No.: 11/847,099

(22) Filed: Aug. 29, 2007

(65) Prior Publication Data

US 2009/0060690 A1    Mar. 5, 2009

(51) Int. Cl.
*H01L 21/677* (2006.01)
(52) U.S. Cl. ........ 414/217; 414/414; 414/805; 414/941; 269/903
(58) Field of Classification Search .................. 414/411, 414/217, 805, 935, 941; 269/55, 56, 58, 269/903
See application file for complete search history.

(56) References Cited

U.S. PATENT DOCUMENTS

| 5,725,728 | A |   | 3/1998 | Fuke et al. |         |
| 6,074,154 | A | * | 6/2000 | Ueda et al. | 414/217 |
| 6,851,170 | B2|   | 2/2005 | Lappen et al. |       |
| 7,074,646 | B2|   | 7/2006 | Kim |                 |
| 7,578,647 | B2| * | 8/2009 | Elliott et al. | 414/411 |

FOREIGN PATENT DOCUMENTS

| JP | 05-067670 A | 3/1993 |
| KR | 102002-0042203 A | 6/2002 |
| KR | 10-2003-0014860 A | 2/2003 |
| KR | 10-2006-0099981 A | 9/2006 |

OTHER PUBLICATIONS

Shinkawa Ltd., "Shinkawa's Equipment Die Bonder," no date [retrieved on Aug. 29, 2007]. Retrieved from the Internet:< URL: http://www.shinkawa.com> (1 page).
Micron Technology, Inc., "Semiconductor Manufacturing: Fabrication," bearing copyright 2006 [retrieved on Aug. 29, 2007]. Retrieved from the Internet:< URL: http://www.micron.com> (1 page).
Micron Technology, Inc., "Semiconductor Manufacturing: Photolithography," bearing copyright 2006 [retrieved on Aug. 29, 2007]. Retrieved from the Internet:< URL: http://www.micron.com> (1 page).
Micron Technology, Inc., "Semiconductor Manufacturing: Implant," bearing copyright 2006 [retrieved on Aug. 29, 2007]. Retrieved from the Internet:< URL: http://www.micron.com> (1 page).
Micron Technology, Inc., "Semiconductor Manufacturing: Probe-Quality Control," bearing copyright 2006 [retrieved on Aug. 29, 2007]. Retrieved from the Internet:< URL: http://www.micron.com> (1 page).
Micron Technology, Inc., "Semiconductor Manufacturing: Assembly," bearing copyright 2006 retrieved on Aug. 29, 2007]. Retrieved from the Internet:< URL: http://www.micron.com> (2 pages).
Micron Technology, Inc., "Semiconductor Manufacturing: Test/Burn-In," bearing copyright 2006 [retrieved on Aug. 29, 2007]. Retrieved from the Internet:< URL: http://www.micron.com> (1 page).
Shinkawa Ltd., "Shinkawa Ltd. Annual Report 2002," Mar. 31, 2002, [retrieved on Aug. 29, 2007]. Retrieved from the Internet:< URL: http://www.shinkawa.com> (32 pages).

* cited by examiner

*Primary Examiner* — Saúl J Rodríguez
*Assistant Examiner* — Willie Berry
(74) *Attorney, Agent, or Firm* — Yingsheng Tung; Wade J. Brady, III; Frederick J. Telecky, Jr.

(57) ABSTRACT

Quick changeover apparatus for wafer handlers capable of handling at least two sizes of wafer frames and methods of using such apparatus are disclosed.

15 Claims, 6 Drawing Sheets

QUICK CHANGEOVER APPARATUS AND METHODS FOR WAFER HANDLING

FIELD OF THE DISCLOSURE

This disclosure relates generally to semiconductor fabrication and, more particularly, to a wafer handler that is capable of handling at least two sizes of wafer frames and to quick changeover apparatus and methods of utilizing such apparatus for such a wafer handler.

BACKGROUND

The production of integrated circuits involves multiple processes. For example, semiconductor devices, bonding pads and other circuitry are fabricated on a semiconductor wafer (e.g., a silicon wafer). During a known portion of the processing, a wafer is sawn into individual dies (also known as "chips") while mounted, such as by dicing tape, on a flexible wafer frame or flexframe. After the sawing operation, each wafer frame is fed through a wafer handler that includes a stretching operation that stretches the dicing tape substrate to assist in spacing the individual dies from each other prior to arriving at an operation that picks the dies off of the dicing tape.

Wafer handling equipment, such as known wafer handlers manufactured and sold by Kabushiki Kaisha Shinkawa, may be capable of accommodating wafers of different sizes and their corresponding wafer frames. For instance, 200 mm and 300 mm diameter wafer sizes on corresponding wafer frames of different sizes are accommodated by such wafer handlers. However, heretofore, considerable unproductive time was required for a machine operator to adapt a wafer handler to switch from handling one size wafer to another size wafer. Such adaptation required tedious and time consuming removal and reinsertion of approximately two dozen individual fasteners to change components or modify portions of the wafer handler.

SUMMARY OF THE INVENTION

The present invention presents improvements in the apparatus and methods used in wafer handling equipment to accommodate at least two different sizes of wafers and their respective flexible wafer frames. In a first aspect of the invention, a wafer handler includes a pusher arm, and a pusher arm extender that is selectively positionable to be engaged by the pusher arm. The wafer handler further includes a buffer assembly having a pair of rails that are coupled to at least one drive mechanism for selective movement between a plurality of spaced apart positions. The apparatus also includes a wafer table assembly having a center body, a wafer ring plate base movable with respect to the center body, a plurality of wafer ring adapters selectively lockable relative to the center body, and a plurality of wafer ring plates selectively lockable to the wafer ring plate base.

In another aspect of the invention, a method of adapting a wafer handler from handling wafers having wafer frames of a first size to handling wafers having wafer frames of a second size is disclosed. The method includes moving a pusher arm extender from a first position wherein it is not engaged by a pusher arm to a second position wherein it is engaged by a pusher arm, and activating at least one actuator to move a pair of rails of a buffer assembly from a first spaced apart position to a second spaced apart position. The method further includes unlocking a first wafer ring plate from a wafer ring plate base of a wafer table assembly and removing the first wafer ring plate, moving a first wafer ring adapter from a locked position to an unlocked position and removing the first wafer ring adapter from a center body of the wafer table assembly. The method also includes placing a second wafer ring adapter on the center body and moving the second wafer ring adapter from an unlocked position to a locked position, placing a second wafer ring plate on the wafer ring plate base and locking the second wafer ring plate to the wafer ring plate base.

In a further aspect of the invention, a method of handling wafer frames to position a wafer frame for stretching a wafer and substrate assembly mounted on the wafer frame is disclosed. The method includes moving a pusher arm into engagement with a pusher arm extender and continuing to move the pusher arm until the pusher arm extender engages a wafer frame of a preselected size and moves the wafer frame from a wafer frame cassette toward a buffer assembly having a pair of rails spaced apart a preselected distance. The method further includes advancing the wafer frame onto the rails, and advancing the rails toward a wafer table assembly. The method also includes advancing the wafer frame to a position wherein it lies between a wafer ring adapter that is removably connected to a center body of the wafer table assembly and a wafer ring plate that is removably latched to a wafer ring plate base of the wafer table assembly.

DETAILED DESCRIPTION

Figure 1:
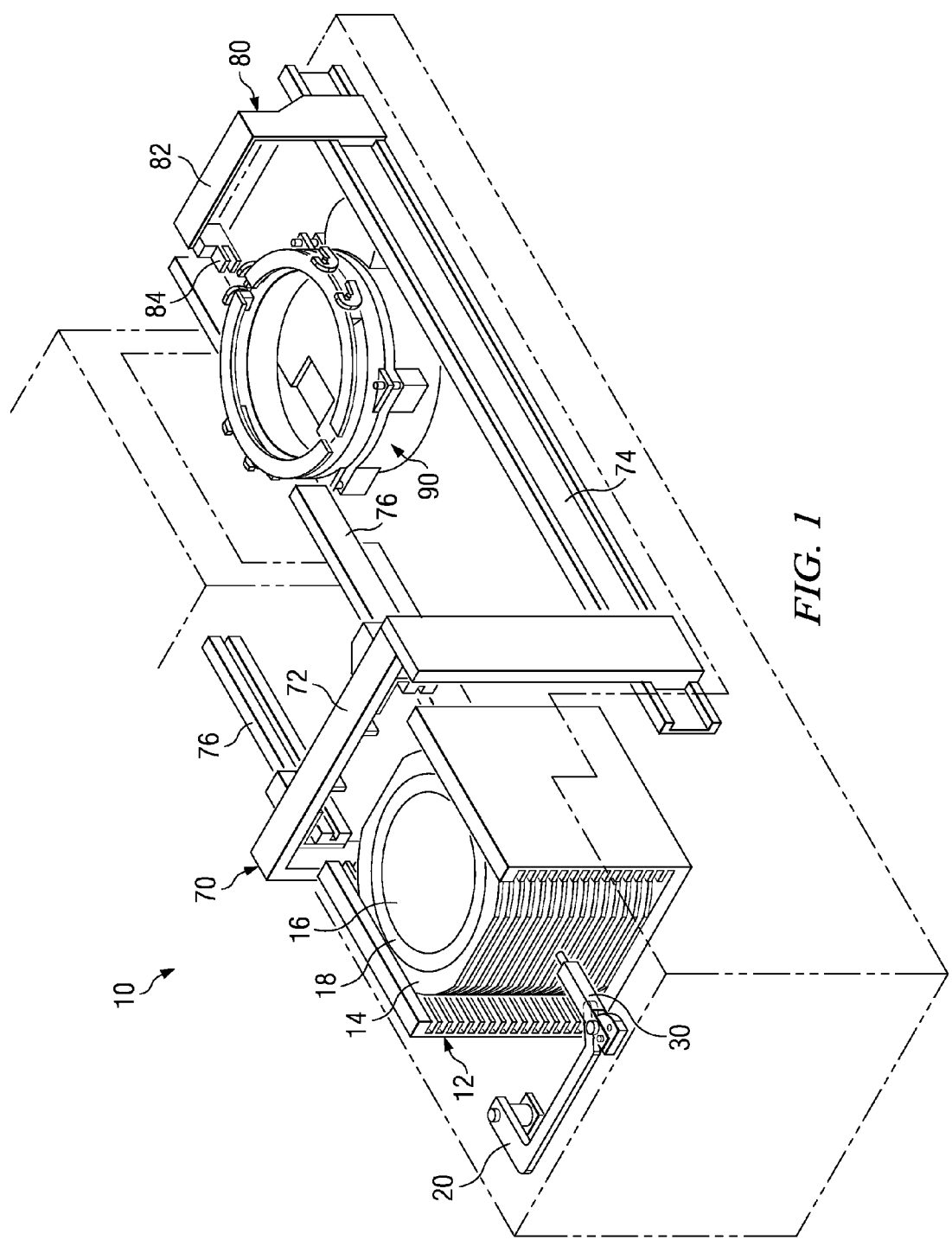
FIG. 1 is an upper perspective view that illustrates an example wafer handler that is constructed in accordance with the teachings of the invention.
Figure 2:
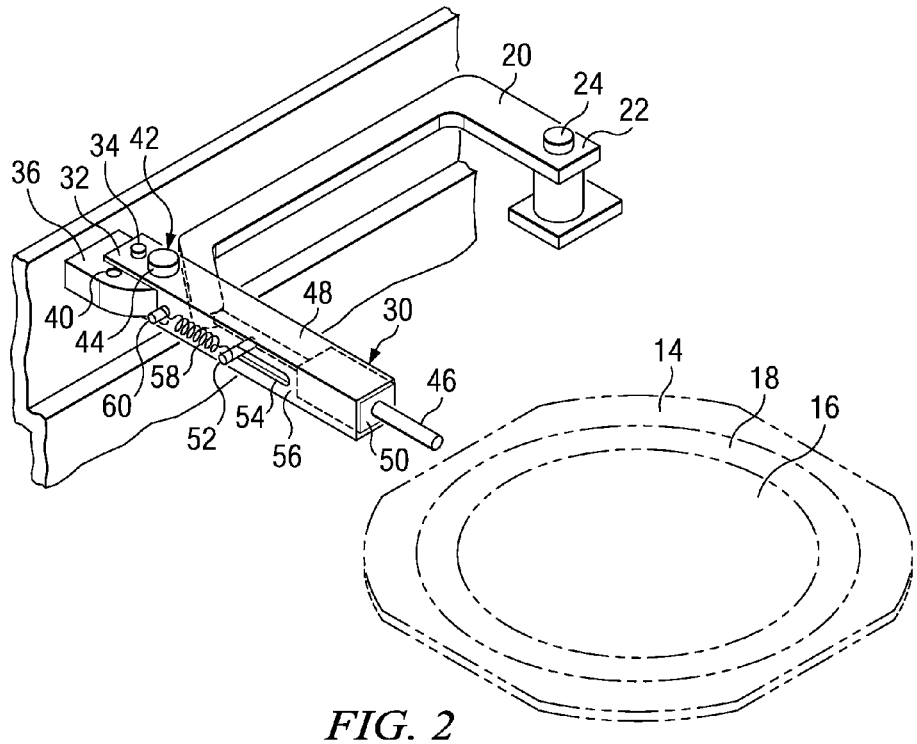
FIG. 2 is an upper perspective view that illustrates an example pusher arm and a quick changeover pusher arm extender in a first, active position for contacting relatively smaller wafer frames.
Figure 3:
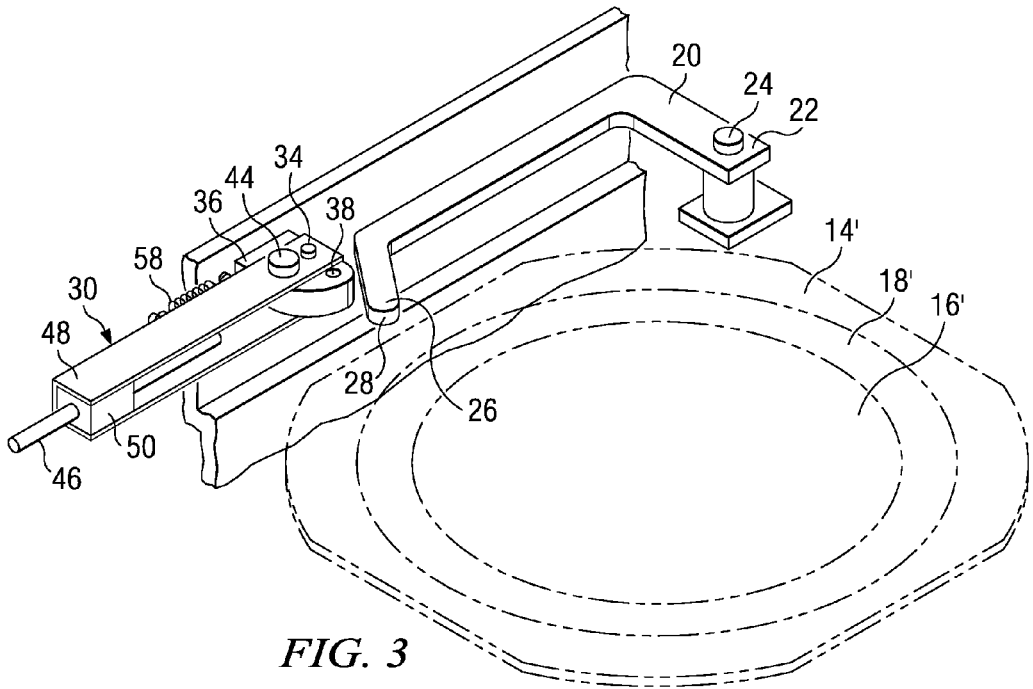
FIG. 3 is an upper perspective view that illustrates the example pusher arm of FIG. 2 with the quick changeover pusher arm extender in a second, inactive position for allowing the pusher arm to directly contact relatively larger wafer frames.

FIGS. 1-11 illustrate an example wafer handler 10 that includes three sections that incorporate quick changeover apparatus to permit an operator to rapidly accommodate the processing of either of two different size wafers. As shown in the example in FIG. 1, in a first section located toward a first end of the wafer handler 10, a cassette 12 holds a series of wafer frames 14. Each wafer frame 14 carries a wafer 16 mounted on a substrate 18, such as dicing tape, which spans a center opening in the wafer frame 14. The wafer and substrate assembly are mounted to a wafer frame 14. Although not shown, each wafer 16 is sawn or sliced into individual dies or chips. In FIG. 1, the cassette 12 holds wafer frames 14 of a first size carrying wafers 16 of a first size, such as wafers having a diameter of 200 mm. The wafer handler 10 also may be equipped to handle cassettes 12' dimensioned to receive relatively larger wafer frames 14' carrying wafers 16' on a substrate 18' spanning a center opening of the wafer frames 14', such as wafers 16' having a diameter of 300 mm, as represented in FIG. 3.

When processing wafers 16, 16' on wafer frames 14, 14' in the first section of the example wafer handler 10, the first operation is to engage and advance, or push, a wafer frame relative to a cassette 12, 12', respectively. To accomplish this task with the smaller wafer frames 14, the example wafer handler 10 uses a pusher arm 20 and a pusher arm extender 30 located in an active position, as shown in FIGS. 1 and 2. To changeover to processing of the relatively larger wafer frames 14', the pusher arm extender 30 is pivoted to an inactive position to permit the pusher arm 20 to directly engage the wafer frames 14', as shown in FIG. 3.

In example quick changeover apparatus as best seen in FIGS. 2 and 3, the pusher arm 20 is pivotably mounted proximate a first end 22 at a pivot 24 and is driven through the pivot by a drive mechanism (not shown). At a second end 26, the pusher arm 20 has a head 28.

As shown in FIGS. 1-3, the pusher arm extender 30 is pivotably mounted proximate a first end 32 at a pivot 34 to a block 36 having additional apertures 38 and 40. The first end 32 of the pusher arm extender 30 also includes a locking mechanism 42 having a pin (not shown) connected to a knob 44 whereby the pin may be selectively placed in the first aperture 38 (shown open in FIG. 3), to locate and lock the pusher arm extender 30 in a first position (shown in FIG. 2), or may be placed in the second aperture 40 (shown open in FIG. 2), to locate and lock the pusher arm extender 30 in a second position (shown in FIG. 3).

The example pusher arm extender 30 also includes a rod 46 slidably mounted to a housing 48 via a bushing 50 having an aperture therethrough. The rod 46 includes a pin 52 mounted to the side of the rod 46. The pin 52 projects through a slot 54 in a side wall 56 of the housing 48. The rod 46 is resiliently biased toward a retracted position by a resilient member 58 such as a spring that is connected at a first end to a pin 60 mounted to the side wall 56 of the housing 48 proximate the first end 32 and at a second end to the pin 52 on rod 46. Thus, with the pusher arm extender 30 pivoted to the first position shown in FIGS. 1 and 2, the pusher arm extender is in an active position wherein pivotal movement of the pusher arm 20 causes the head 28 of the pusher arm 20 to engage the rod 46 at a first end and the rod 46, in turn, to slidably move forward to engage a wafer frame 14 at a second end, so as to advance the wafer frame 14 relative to the cassette 12. As the pusher arm 20 is pivoted back to a starting position, the resilient member 58 also returns the rod 46 of the pusher frame extender 30 to a starting (e.g., retracted) position.

With an example pusher arm extender 30 made in accordance with the teachings of the invention, the wafer handler 10 may be quickly changed over to accommodate processing of the relatively larger wafers 16' on corresponding larger wafer frames 14'. For instance, by lifting the knob 44 the pin associated therewith will be removed from aperture 38, thereby permitting the pusher arm extender to be pivoted to the second position, shown in FIG. 3. The knob 44 may then be lowered to place the pin (not shown) in the aperture 40, thereby locking the pusher arm extender 30 in an inactive position. With the pusher arm extender 30 in this inactive position, the pusher arm 20 is permitted to pivot and directly engage and advance a wafer frame 14' relative to a cassette 12'.

In the illustrated example, changeover of the wafer handler 10 with respect to the pusher arm operation and the ability to accommodate different sizes of wafers and wafer frames may be accomplished in a very rapid and efficient manner. In essence, to relocate the pusher arm extender 30 from the first, active position shown in FIG. 2 for use with relatively smaller wafer frames 14 to a second, inactive position shown in FIG. 3 where it is not used in advancing larger wafer frames 14', the pusher frame extender 30 simply is unlocked and pivoted to the inactive position where it will not be engaged during pivotal cycling of the pusher arm 20. To change the pusher operation of the wafer handler 10 back to being able to handle relatively smaller wafer frames 14, the pusher frame extender 30 is again unlocked, and then pivoted to the active position where it will be engaged by the pusher arm 20 to assist in reaching and pushing the wafer frames 14.

It will be appreciated that whether handling a series of smaller or larger wafer frames in their respective cassettes, each cassette is indexed to a plurality of different respective height positions to permit each wafer frame to be individually engaged and advanced relative to the cassette. Also, alternative locking mechanisms or automated assemblies may be used to move and retain the pusher arm extender in active and inactive positions.

Figure 4:
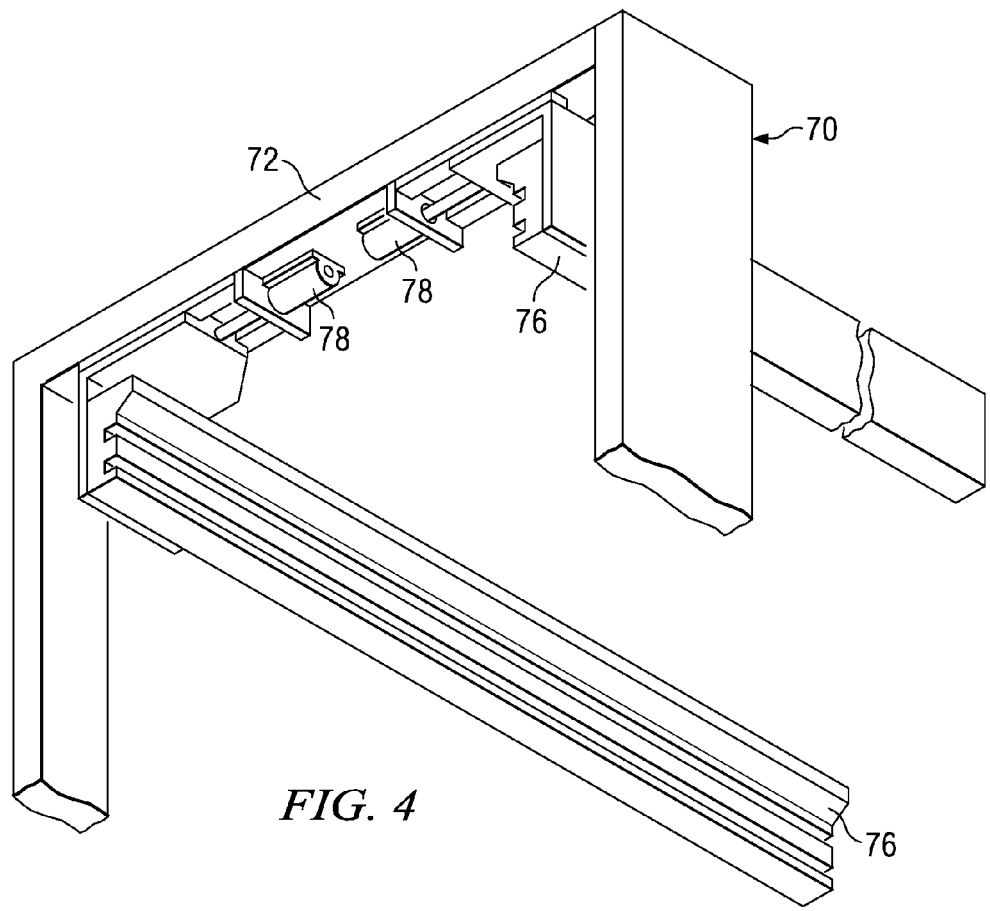
FIG. 4 is a lower perspective view that illustrates an example buffer assembly having quick changeover rails for receiving and transferring wafer frames of at least two different sizes.

As shown in FIGS. 1 and 4, a buffer assembly 70 is located in a second, central section of the example wafer handler 10. The example buffer assembly 70 includes an upper support 72 slidably mounted to a track system 74 to permit the upper support 72 to be moved by a drive system (not shown) between positions proximate the rear of a cassette 12, 12' and proximate a wafer table assembly 90 toward the rear of the wafer handler 10.

The buffer assembly 70 also includes a pair of rails 76 slidably coupled to the upper support 72, and a pair of actuators 78. In the illustrated example, each actuator 78 is fixedly mounted to the upper support 72 while being coupled to a rail 76. In this example, each actuator 78 is a linear actuator having an air cylinder controlled by a pneumatic switch (not shown). Both actuators 78 may be controlled by a common switch that when activated causes the actuators 78 to move the rails 76 from a first position wherein they are spaced a first distance apart to a second position wherein they are spaced a second distance apart.

The buffer rail assembly 70 is initially positioned proximate the rear of a cassette 12, 12' to receive a wafer frame 14, 14' as it is advanced from the cassette 12, 12', respectively. Depending on the size of the wafer frames being processed, a wafer frame 14, 14' initially is advanced by the pusher arm 20, or by the pusher arm 20 and the pusher arm extender 30, respectively, until it projects outward from the rear of the respective cassette 12, 12'.

A loader arm 80 (see FIG. 1) includes a support 82 and a gripping assembly 84. The loader arm 80 is slidably mounted to a track system, shown here as being the common track system 74, to permit the support 82 to be moved by a drive system (not shown) to positions between being parked behind the rear of the wafer table assembly 90 to being moved toward the rear of a cassette 12, 12'. While a wafer frame 14, 14' is being advanced to project outward from the rear of a cassette 12, 12', as described above, the buffer assembly 70 and loader arm 80 are positioned proximate the rear of the cassette. The gripping assembly 84 on the loader arm 80 then grasps the respective wafer frame. The loader arm 80 and wafer frame then are advanced toward the wafer table assembly 90 until the wafer frame is positioned between the rails 76 of the buffer assembly 70. The gripping assembly 84 then releases the wafer frame, permitting the wafer frame to be held by the rails 76, and the loader arm 80 is moved back to its parked position behind the rear of the wafer table assembly 90. With a wafer frame held by the rails 76, the buffer assembly 70 is advanced toward the wafer table assembly 90.

Figure 5A:
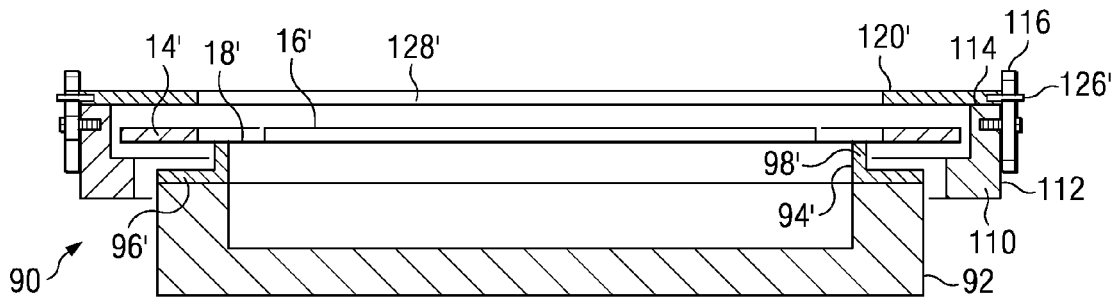
FIG. 5A is a partial cross sectional view that illustrates an example wafer table assembly having a quick changeover wafer ring plate and wafer ring adapter.
Figure 5B:
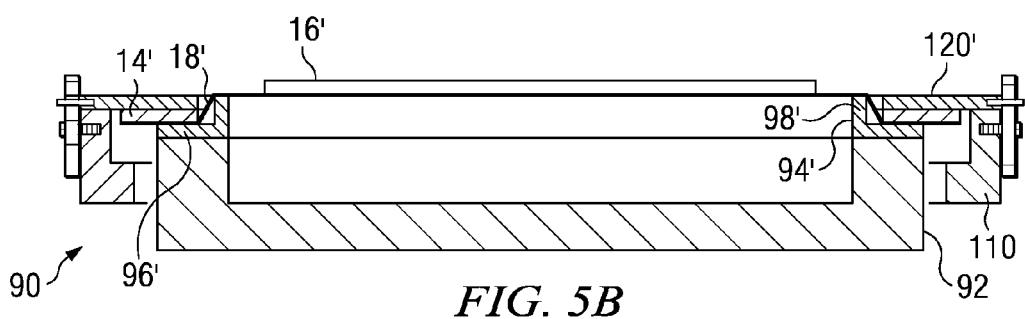
FIG. 5B is a partial cross sectional view that illustrates the example wafer table assembly of FIG. 5A in a stretching position.
Figure 8:
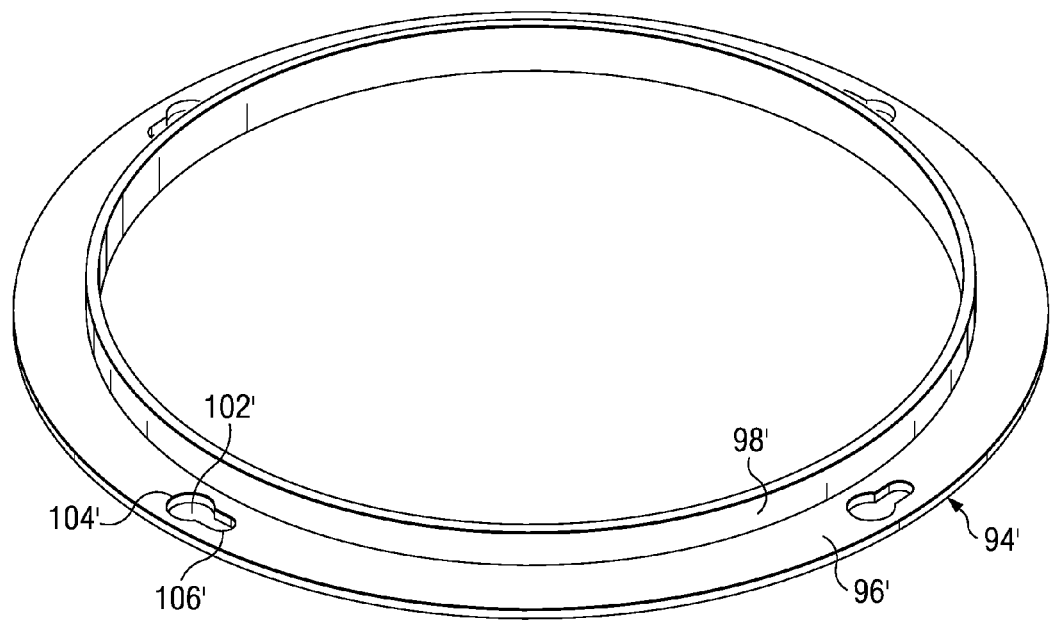
FIG. 8 is an upper perspective view that illustrates an example wafer ring adapter having a quick changeover fastening construction for selective coupling to a center body of a wafer table assembly.

The wafer table assembly 90 is located in the third section of the example wafer handler 10 having quick changeover apparatus. As shown in FIGS. 5A and 5B, the example wafer table assembly 90 includes a center body 92. The center body 92 receives a wafer ring adapter 94, seen in FIG. 10 in a first size for handling relatively smaller wafer frames 14 and wafers 16. The wafer ring adapter 94 includes a planar base portion 96 and an upstanding wall 98. The diameter of the wafer ring adapter 94 at the upstanding wall 98 is dimensioned to be between the outer diameter of a wafer 16 and the inner diameter of the wafer frame 14. A wafer ring adapter 94' is seen in FIGS. 8 and 11 in a second size for handling relatively larger wafer frames 14' and wafers 16'. The wafer ring adapter 94' similarly includes a planar base portion 96' and an upstanding wall 98'. The diameter of the wafer ring adapter 94' at the upstanding wall 98' is dimensioned to be between the outer diameter of a wafer 16' and the inner diameter of the wafer frame 14'.

The example first and second wafer ring adapters 94 and 94' are configured to permit either wafer ring adapter to be quickly mounted to and dismounted from the center body 92. A plurality of fasteners 100 are used to mount either wafer ring adapter 94 or 94' to the center body 92. To facilitate quick changeover between the respective wafer ring adapters 94 and 94', each base portion 96, 96' includes a similar plurality of elongated mounting apertures 102, 102'. Each aperture 102, 102' is dimensioned at a first end 104, 104' for passage of the head of a fastener 100 through the aperture 102, 102' and is dimensioned at a second end 106, 106' to prevent passage of the head of the fastener 100 through the aperture 102, 102'.

Figure 9A:
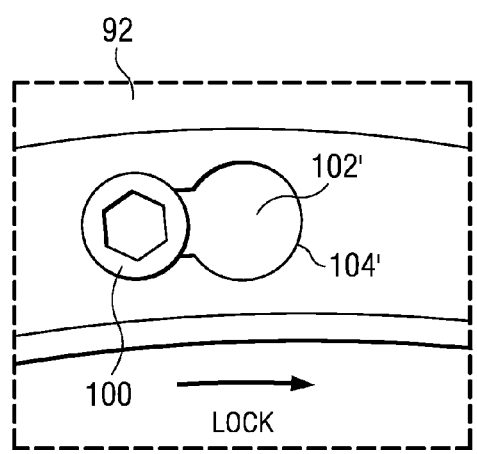
FIG. 9A is a partial top view of the example wafer ring adapter of FIG. 8 in a locked position.
Figure 9B:
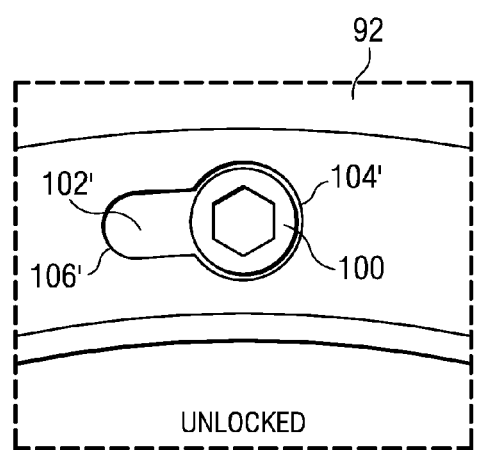
FIG. 9B is a partial top view of the example wafer ring adapter of FIG. 8 in an unlocked position.

Thus, a respective wafer adapter ring 94, 94' may be mounted to the center body 92 by slightly loosening the fasteners 100, and then aligning the larger opening of the first end 104, 104' of the elongated apertures 102, 102' with the fasteners 100 and placing the wafer adapter ring 94, 94' over the heads of the fasteners 100, and bringing the wafer ring adapter 94, 94' to rest on top of the center body 92. The wafer adapter ring 94, 94' is then rotated to move the smaller opening portions at the second end 106, 106' of the elongated apertures 102, 102' to be located below and thereby trapped by the heads of the fasteners 100. The fasteners 100 then are tightened to hold the respective wafer ring adapter 94, 94' in a locked position. A wafer ring adapter 94, 94' similarly may be swiftly and conveniently removed by slightly loosening the fasteners 100 and rotating the wafer ring adapter 94, 94' to again align the larger opening of the first end 104, 104' of the elongated apertures 102, 102' with the heads of the fasteners 100, and then simply lifting the wafer ring adapter 94, 94' away from the center body 92. These rotational locking structures and methods are shown in FIGS. 8, 9A and 9B, with respect to the larger wafer ring adapter, but the locking structure for the smaller wafer ring adapter is identical. These structures and methods assure a quick changeover without requiring full removal of fasteners and, thus, the potential to drop or misplace fasteners.

Figure 6:
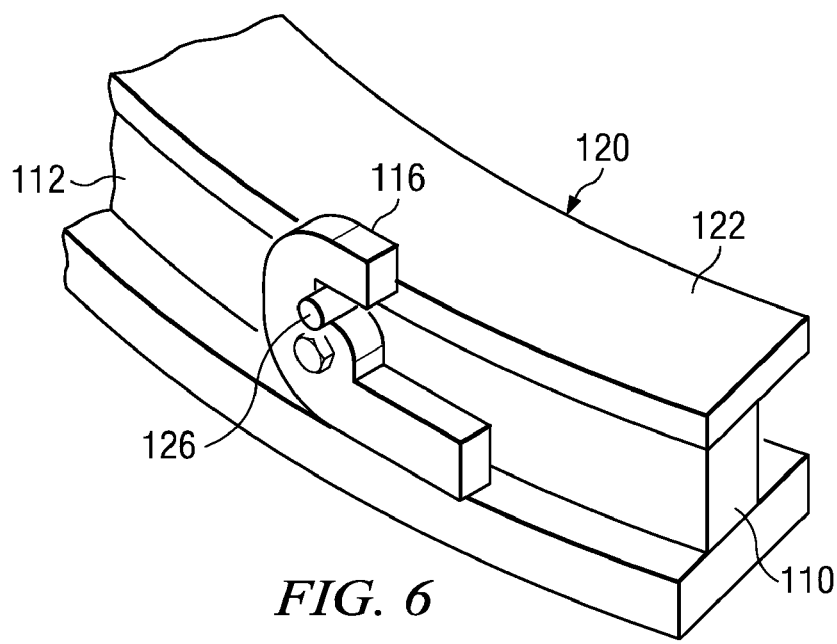
FIG. 6 is an upper perspective view that illustrates the example quick changeover apparatus for coupling a wafer ring plate to a wafer ring plate base of a wafer table assembly of FIG. 5A.

The wafer table assembly 90 also includes a wafer ring plate base 110 that, as shown in FIGS. 5A, 5B and 6, is dimensioned to be located outside of the center body 92 and has an outer peripheral wall 112 and an upper surface 114. The outer peripheral wall 112 includes a plurality of locking mechanisms, in the form of latches 116 that are pivotably mounted thereto.

Figure 10:
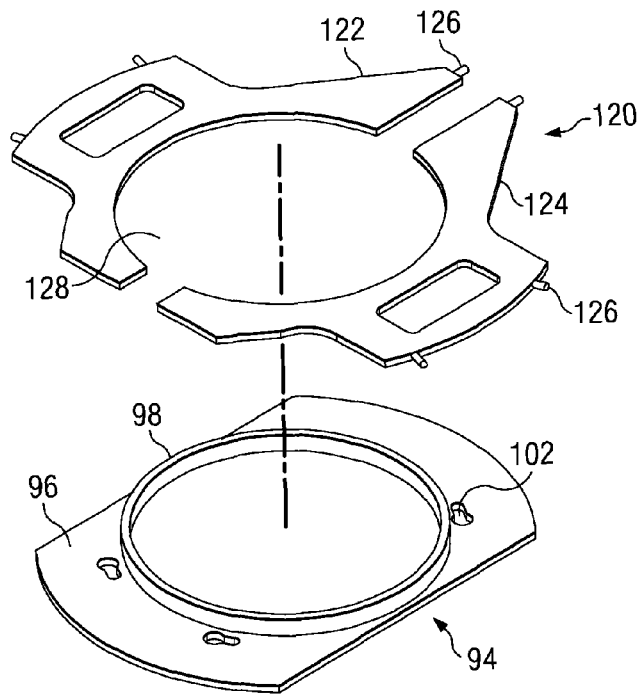
FIG. 10 is an exploded perspective view of a wafer ring plate and corresponding wafer ring adapter having quick changeover construction for use in processing relatively smaller wafer frames.
Figure 11:
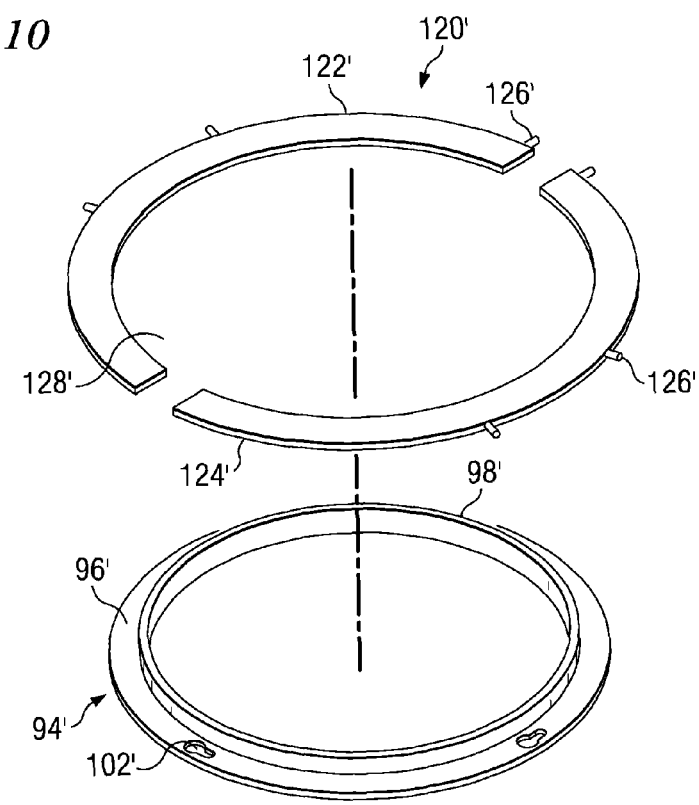
FIG. 11 is an exploded perspective view of a wafer ring plate and corresponding wafer ring adapter having quick changeover construction for use in processing relatively larger wafer frames.

The wafer ring plate base 110 receives on its upper surface a wafer ring plate 120, shown for example in FIG. 10 for use with relatively smaller wafer frames 14 and wafers 16. The example wafer ring plate 120 includes a pair of relatively semi-circular shaped plates 122, 124 having projections in the form of pins 126 extending radially outward from an outer edge of the plates 122, 124. The plates 122, 124 are spaced apart from each other to permit the gripper assembly 84 of the loader arm 80 to pass therebetween. The plates 122, 124 also define a circular central opening 128. The diameter of the central opening 128 is dimensioned to be larger than the diameter of the upstanding wall 98 of the wafer ring adapter 94 and smaller than the center opening in the wafer frame 14.

In a similar manner, the wafer ring plate base 110 also may receive on its upper surface a wafer ring plate 120', shown for example in FIG. 11 for use with relatively larger wafer frames 14' and wafers 16'. The example wafer ring plate 120' includes a pair of relatively semi-circular shaped plates 122', 124' having projections in the form of pins 126' extending radially outward from an outer edge of the plates 122', 124'. The plates 122', 124' are spaced apart from each other to permit the gripper assembly 84 of the loader arm 80 to pass therebetween. The plates 122', 124' also define a circular central opening 128'. The diameter of the central opening 128' is dimensioned to be larger than the diameter of the upstanding wall 98' of the wafer ring adapter 94' and smaller than the center opening in the wafer frame 14'.

Figure 7A:
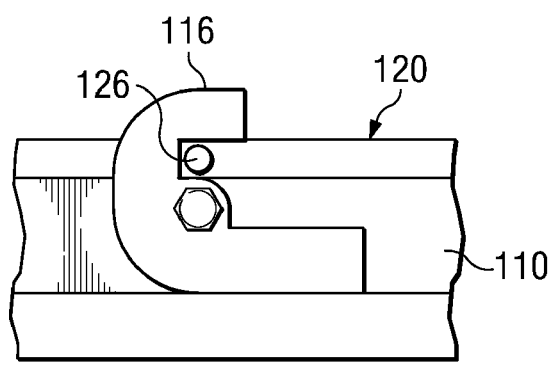
FIG. 7A is a partial front view of the quick changeover apparatus of FIG. 6 shown in a latched position.
Figure 7B:
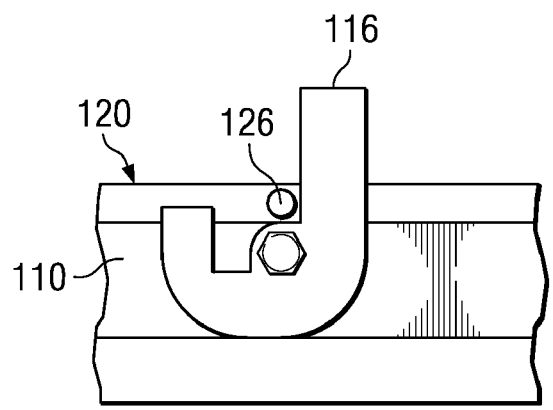
FIG. 7B is a partial front view of the quick changeover apparatus of FIG. 6 shown in an unlatched position.

The latches 116 and respective pins 126, 126' facilitate quick changeover between the respective wafer ring plates 120, 120'. Thus, when an operator needs to change from a first wafer ring plate 120 for processing relatively smaller wafer frames 14 and wafers 16 to the second, relatively larger wafer ring plate 120' for processing relatively larger wafer frames 14' and wafers 16', the latches 116 on the wafer ring plate base 110 are rotated from a locked, first position in which they capture the pins 126 and prevent the wafer ring plate 120 from being lifted, as shown in FIGS. 6 and 7A, to an unlocked, second position in which they no longer block upward movement of the pins 126 and permit the wafer ring plate 120 to be lifted, as shown in FIG. 7B. In this manner, either wafer ring plate 120, 120' may be installed and locked to the wafer ring plate base 110 or unlocked and removed from the wafer ring plate base 110. This provides an efficient and timely way for an operator to changeover the wafer ring plates when needed.

As shown in FIG. 5A, with a wafer ring adapter 94' locked in place on a center body 92 and a corresponding wafer ring plate 120' locked to the wafer ring plate base 110, the wafer table assembly 90 is prepared to receive a wafer frame 14' for the stretching operation. As the buffer assembly 70 having a wafer frame 14' held on the rails 76 arrives at the wafer table assembly 90, the loader arm 80 moves the gripper assembly 84 toward the wafer frame 14', grasps the wafer frame 14' and advances it into the wafer table assembly 90. The loader arm 80 places the wafer ring 14' with the wafer 16' and substrate 18' on a wafer ring adapter 94', as shown in FIG. 5A, and then the loader arm 80 returns to its parked position behind the wafer table assembly 90. Once the wafer frame 14' has been removed from the rails 76 by the loader arm 80, the buffer assembly 70 also is moved back toward the cassette 12'.

At the wafer table assembly 90, the wafer 16', adhered atop a substrate 18' which is mounted to a wafer frame 14', is then stretched to separate the dies from each other, for further processing. In essence, with the wafer frame 14' loaded in the wafer table assembly 90, the wafer ring plate base 110 is lowered relative to the center body 92, as shown in FIG. 5B. In this position, due to the offset in surfaces between the upstanding wall 98' of the wafer ring adapter 94' and the inner opening 128' of the wafer ring plate 120, the substrate 18' is stretched, causing the individual dies or chips that are mounted to the substrate 18' to separate from each other. As a result, individual dies can be picked up off the substrate for placement on a circuit board or other location.

Accordingly, with the example quick changeover apparatus described above and shown in the drawings, one may change a wafer handler from being adapted to handle wafers having wafer frames of a first size to being adapted to handle wafers having wafer frames of a second size. For instance, to go from processing larger wafers to smaller wafers, a pusher arm extender may be moved from a first position wherein it is not engaged by a pusher arm to a second position wherein it is engaged by a pusher arm. Also, at least one actuator may be activated to move a pair of rails of a buffer assembly from a first spaced apart position to a second, more closely spaced apart position. Further, a first wafer ring plate may be unlocked from a wafer ring plate base of a wafer table assembly and removed from the first wafer ring plate base. A first wafer ring adapter may then be moved from a locked position to an unlocked position and removed from a center body of the wafer table assembly. A second wafer ring adapter may be placed on the center body, the second wafer ring adapter may be moved from an unlocked position to a locked position where it may be fixed in place, and a second wafer ring plate may be placed on the wafer ring plate base and locked to the wafer ring plate base.

From the foregoing, persons of ordinary skill in the art will appreciate that example apparatus for quickly adapting a wafer handler to process wafers of different sizes and example methods of achieving such changeover have been disclosed. The disclosed examples are particularly advantageous in their ease of use and time savings for an operator. More specifically, prior art structures and methods of adapting wafer handlers typically require the removal of numerous individual fasteners, removal of hardware for processing a first size of wafers, deployment of hardware for processing a second size of wafers, and then reinstallation of the numerous individual fasteners. Therefore, the prior art structures and methods required more time and effort, and had potential for further interruptions that could be caused, for instance, if any of the numerous fasteners were accidentally dropped. In contrast, the example quick changeover apparatus and methods illustrated herein include one or more structures to enable swift and confident changeover of a wafer handler for processing wafers of different sizes.

Although certain example apparatus, methods and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A wafer handler comprising:
   a pusher arm;
   a pusher arm extender selectively positionable to be engaged by the pusher arm;
   a buffer assembly having a pair of rails coupled to at least one drive mechanism for selective movement between a plurality of spaced apart positions; and
   a wafer table assembly comprising a center body, a wafer ring plate base including a plurality of latches movable with respect to the center body, a plurality of wafer ring adapters selectively lockable to the center body, and a plurality of wafer ring plates selectively lockable to the wafer ring plate base.

2. The wafer handler of claim 1, wherein the pusher arm extender is pivotably movable between a first position and a second position.

3. The wafer handler of claim 1, wherein the pusher arm extender further comprises a shaft that is resiliently biased toward a retracted position.

4. The wafer handler of claim 1, wherein the rails are slidably coupled to an upper support.

5. The wafer handler of claim 1, wherein the at least one drive mechanism further comprises a linear actuator.

6. The wafer handler of claim 5, wherein each rail is coupled to a linear actuator.

7. The wafer handler of claim 1, wherein the plurality of latches are pivotable.

8. The wafer handler of claim 1, wherein each wafer ring plate further comprises a plurality of sections.

9. The wafer handler of claim 8, wherein at least one of the sections of the wafer ring plate has a plurality of projections extending radially outward from an outer edge.

10. The wafer handler of claim 1, wherein each wafer ring adapter is rotatable between respective locked and unlocked positions.

11. The wafer handler of claim 1, wherein each wafer ring adapter further comprises a plurality of elongated mounting apertures dimensioned at a first end for passage of a fastener head through the aperture and dimensioned at a second end to prevent passage of the fastener head through the aperture.

12. A method of adapting a wafer handler from handling wafers having wafer frames of a first size to handling wafers having wafer frames of a second size, comprising:
   moving a pusher arm extender from a first position to a second position wherein the pusher arm extender is engaged by the pusher arm in one of the first or second positions;
   activating at least one actuator to move a pair of rails of a buffer assembly from a first spaced apart position to a second spaced apart position;
   unlocking a first wafer ring plate from a wafer ring plate base of a wafer table assembly by pivoting a latch to an unlatched position and removing the first wafer ring plate;
   moving a first wafer ring adapter from a locked position to an unlocked position and removing the first wafer ring adapter from a center body of the wafer table assembly;

placing a second wafer ring adapter on the center body and moving the second wafer ring adapter from an unlocked position to a locked position; and placing a second wafer ring plate on the wafer ring plate base and locking the second wafer ring plate to the wafer ring plate base.

13. The method of claim 12, wherein moving the pusher arm extender further comprises pivoting the pusher arm extender from the first position to the second position.

14. The method of claim 12, wherein activating the at least one actuator further comprises activating a linear actuator.

15. The method of claim 12, wherein moving a first wafer ring adapter from a locked position to an unlocked position comprises rotating the first wafer ring adapter relative to the center body.

* * * * *